United States Patent
Pannell

(10) Patent No.: US 7,405,512 B2
(45) Date of Patent: Jul. 29, 2008

(54) ACOUSTIC TRANSDUCERS HAVING LOCALIZED FERROELECTRIC DOMAIN INVERTED REGIONS

(75) Inventor: Christopher N. Pannell, Orlando, FL (US)

(73) Assignee: Gooch and Housego PLC, Somerset (GB)

( * ) Notice: Subject to any disclaimer, the term of this patent is extended or adjusted under 35 U.S.C. 154(b) by 0 days.

(21) Appl. No.: 11/473,096

(22) Filed: Jun. 22, 2006

(65) Prior Publication Data

US 2007/0296303 A1    Dec. 27, 2007

(51) Int. Cl.
    H01L 41/08    (2006.01)
(52) U.S. Cl. ...................................... 310/359
(58) Field of Classification Search .................. 310/359
    See application file for complete search history.

(56) References Cited

U.S. PATENT DOCUMENTS

| | | | | |
|---|---|---|---|---|
| 3,018,451 | A * | 1/1962 | Mattiat | 333/187 |
| 3,994,600 | A * | 11/1976 | Tarasevich et al. | 356/139.01 |
| 4,129,799 | A * | 12/1978 | Green | 310/359 |
| 4,155,055 | A * | 5/1979 | Phillips | 333/153 |
| 4,979,176 | A * | 12/1990 | Young et al. | 372/13 |
| 5,022,729 | A * | 6/1991 | Tamada et al. | 359/328 |
| 5,550,792 | A | 8/1996 | Crandall et al. | |
| 5,838,486 | A * | 11/1998 | Sonoda et al. | 359/332 |
| 5,946,128 | A * | 8/1999 | Paek | 359/305 |
| 6,363,189 | B1 * | 3/2002 | Minakata et al. | 385/41 |
| 6,522,794 | B1 * | 2/2003 | Bischel et al. | 385/4 |
| 2002/0135270 | A1 | 9/2002 | Ballandras et al. | |
| 2003/0205947 | A1 | 11/2003 | Klee et al. | |
| 2004/0192040 | A1 * | 9/2004 | Peng et al. | 438/689 |
| 2004/0207903 | A1 * | 10/2004 | Apostolopoulos et al. | 359/321 |
| 2006/0044644 | A1 * | 3/2006 | Wu et al. | 359/332 |
| 2006/0207496 | A1 * | 9/2006 | Koto et al. | 117/4 |

FOREIGN PATENT DOCUMENTS

| | | | |
|---|---|---|---|
| EP | 0 615 225 | | 9/1994 |
| GB | 2354597 | * | 3/2001 |
| JP | 55-011271 | * | 1/1980 |
| JP | 7-281224 | * | 10/1995 |
| JP | 2003-43432 | * | 2/2003 |

OTHER PUBLICATIONS

Larow et al. "Focused acoustic wave acoustic-optic device using a planar domain-inverted lithium niobate transducer", Optics Communications, (1994) vol. 144, pp. 161-164.

(Continued)

Primary Examiner—Thomas M. Dougherty
(74) Attorney, Agent, or Firm—Darby & Darby; Neil R. Jetter

(57) ABSTRACT

An acoustic transducer comprises a ferroelectric crystal having a plurality of spaced apart ferroelectric domain inverted regions and at least one non-inverted region. An electrode layer is disposed on one side of the crystal electrically contacting both the domain inverted portion and the non-inverted portion of the crystal. On a side of the crystal opposite the electrode layer, a first electrode is disposed on the domain inverted portion spaced apart from a second electrode disposed on the non-inverted portion. As a result, the acoustic transducer provides sub-transducers hooked in series having effective areas defined by the areas of their respective electrodes.

22 Claims, 7 Drawing Sheets

OTHER PUBLICATIONS

Nakamura et al. "An Ultrasonic Transducer for Second Harmonic Imaging Using a LiNbO3 Plate with a Local Ferroelectric Inversion Layer", IEEE Transactions on Ultrasonics, Ferroelectrics and Frequency Control, (2006) vol. 53, No. 3, pp. 651-655.

Mizuuchi et al. "Fabrication of period domain inversion in an x-cut LiTaO3", Appl. Phys. Lett., (1993) vol. 62, No. 16, pp. 1860-1862.

Nakamura et al. "Broadband Ultrasonic Transducers Using a LiNbO3 Plate with a Ferroelectric Inversion Layer", IEEE Transactions on Ultrasonics, Ferroelectrics and Frequency Control, (2003) vol. 50, No. 11, pp. 1558-1562.

Nakamura et al. "Ferroelectric domain inversion caused in LiNbO3 plates by heat treatment", Appl. Phys. Lett., (1987) vol. 50, No. 20, pp. 1413-1414.

* cited by examiner

ACOUSTIC TRANSDUCERS HAVING LOCALIZED FERROELECTRIC DOMAIN INVERTED REGIONS

FIELD OF THE INVENTION

The present invention relates to acoustic transducers and acousto-optical devices, and more particularly to acoustic transducers and acousto-optic devices having highly apodized acoustic fields.

BACKGROUND OF THE INVENTION

Acoustic transducers are generally based on piezoelectric materials. Most piezoelectric materials in common usage are also ferroelectric, i.e. they possess a permanent electric dipole, the direction of which may be reversed by the application of external stimuli such as electric fields, chemical treatment, and heat, in various combinations. Two of the most common materials for transducer construction in the acousto-optics industry, lithium niobate, formula $LiNbO_3$, abbreviated as LN, and lithium tantalate, formula $LiTaO_3$, abbreviated LT, are in this category. The piezoelectric element is the heart of the transducer as it converts electrical energy to acoustic energy, and vice versa. The piezoelectric is usually in the form of a thin parallel-sided plate and has thin electrodes attached to two of its opposite faces. When a periodic electric field is applied across the piezoelectric material, the local polarization in the material changes and produces a time-varying mechanical strain. It is this varying mechanical strain which propagates away from the transducer in the form of an acoustic wave.

Acoustic transducers are currently used for a variety of purposes. For example, ultrasonic transducers are used for imaging applications, such as medical imaging and industrial non-destructive testing. Acoustic transducers are also used for high power applications including medical treatment, sonochemistry and industrial processing. Ultrasonic transducers can inject ultrasound waves into the body, receive the returned wave, and convert the returned wave to an electrical signal (a voltage). Most medical ultrasound transducers are piezoelectric-based.

Devices in which an acoustic beam and an optical beam interact are generally referred to as "acousto-optic devices" or AO devices. Examples of common AO-based devices include acousto-optic tuneable filters (AOTFs), acousto-optic modulators, (also called "Bragg cells"), and acousto-optic deflectors. In most commercial AO devices, the acoustic beam is introduced into an acousto-optic (AO) interaction medium, such as $TeO_2$, using an acoustic transducer in the form of a plate of a crystalline piezoelectric material, such as lithium niobate (LN). A top electrode is used to excite acoustic vibrations in the transducer. A metal ground electrode is used before bonding, and the metal top electrode is deposited on the upper surface, forming a structure analogous to a parallel plate capacitor. An RF generator is connected between the ground electrode and the top electrode via a suitable broadband electrical matching network to limit reflection of RF energy, and serves to produce mechanical vibrations in the plate due to the piezoelectric effect. These vibration waves pass into the AO interaction medium, where they produce changes of refractive index and hence diffraction of the incident optical fields, after which they are generally absorbed by a suitable absorber of acoustic waves to prevent acoustic reflections inside the interaction medium, which can degrade the performance of the device.

The local strength of the acoustic wave generated by a piezoelectric transducer depends on the product of (1) the local electric field strength and (2) the local piezoelectric activity, the latter being related to the crystal structure of the transducer. Usually the transducer used in acousto-optic devices is a single crystal of lithium niobate (LN). Lithium tantalate (LT) is less frequently used. A piezoelectric material such as LN is a so-called "hard ferroelectric" and it is difficult to manipulate the local piezoelectric strength in the way it is possible to manipulate the local piezoelectricity of a piezoelectric ceramic. This latter material being typically used in acoustic transducers for generation of lower frequency (tens to hundreds of KHz) acoustic waves for example in sonar applications. Thus, it is relatively easy to arrange for a sonar transducer launching an acoustic beam into water to be apodized by controlling the degree of local poling of the piezoelectric material, and so generate an acoustic beam of arbitrary spatial intensity distribution, but it is comparatively difficult to apodize the beam from a LN transducer launching an acoustic beam into an AO crystal. A designer generally has only two options in practice; to attempt alter the piezoelectric activity or to locally alter the electric field strength.

It has long been known that the domain structure of a ferroelectric material such as LN or LT may be inverted by a number of different techniques including, but not limited to, application of an electric field, heating, or chemical treatment along with heating. The inversion is generally maintained once achieved and does not require refresh cycles allowing use of this phenomena to produce ferroelectric memory. The non-volatility in ferroelectric memory is derived from two stable states of polarization and the energy barrier that must be overcome to switch between them. It is noted that all ferroelectric materials are also necessarily piezoelectric, (although the converse is not necessarily true), a consequence of the constraints of crystal symmetry at the atomic level.

A domain inverted layer can be formed on the surfaces of 36°-rotated y-cut plates of LN frequently used for longitudinal acoustic wave generation, by heating to 1100° C. for 2 hours (adjacent to positive surface, thickness of inverted layer formed approximately 160 μm). It is known to be important to ramp the temperatures up and down slowly to avoid cracking, and a temperature change of up to 50° C./minute is generally considered safe. In order to avoid loss of lithium from the surface of the LN, it is customary to flow argon gas containing water vapor over the sample during the heat cycling process.

It is generally difficult to domain-invert any LN or LT cut which contains the crystal c-axis, such as the x-cut. In comparison, inverting z-cut material is relatively easy and is routinely done at room temperature. The 36° rotated y-cut often used for longitudinal acoustic wave generation in AO has the c-axis inclined at 36-degrees to the plane of the crystal plate, and this makes it rather more difficult to invert. However, this can now be routinely inverted, such as disclosed in Nakamura K et al, "An ultrasonic transducer for second harmonic imaging using a $LiNbO_3$ crystal", IEEE Transactions on Ultrasonics, Ferroelectrics and Frequency Control, Vol. 53, No. 3, March 2006, p 651-655 and Nakamura K, et al., "Broadband ultrasonic transducers using a LiNbO3 plate with a ferroelectric inversion layer", IEEE Transactions on Ultrasonics, Ferroelectrics and Frequency Control, Vol. 50, No. 11, November 2003, p 1558-1562.

There is significant interest in the generation and control of shear acoustic waves in AO devices, and in particular in AOTFs, and for this the z and the 36° rotated y-cuts are inappropriate because these devices require shear acoustic waves for operation, and the z and the 36° rotated y-cuts generate longitudinal waves. Usually the so-called x-cut or the 163° rotated y-cut are used to generate shear waves. The x-cut has the c-axis actually in the plane of the plate. However, it has been demonstrated that the x-cut can be inverted by depositing metal electrodes on one side of the plate and applying an electrical voltage between the electrodes while heating, in such a way that the c-axis is reversed in the region between the electrodes. The resulting inversion layer extends to a depth typically of a few tens of µm. Inversion in the other shear cut, the 163°-rotated y-cut, is only slightly more difficult than the 36° rotated y-cut as the c-axis is inclined to the plane of the plate by 17°, approximately one half of the value for the 36° rotated y-cut, but generally still enough to work with.

Although AO devices having transducers which include a domain inverted layer are known, such transducers do not significantly increase the radiation resistance, which is desirable in large area acoustic transducers because it facilitates broadband electrical matching and permits generation of spatially varying acoustic wave fields.

SUMMARY

An acoustic transducer comprises a ferroelectric crystal including a plurality of spaced apart domain inverted portions and at least one non-inverted portion. An electrode layer is disposed on one side of the ferroelectric crystal contacting both the domain inverted portions and the non-inverted portion. On a side of the ferroelectric crystal opposite the electrode layer a first electrode is disposed on the domain inverted portions spaced apart from a second electrode disposed on the non-inverted portion, wherein sub-transducers hooked in series are formed having respective effective areas defined by an area of the first and second electrodes. In one embodiment, the domain inverted portions extend through an entire thickness of the ferroelectric crystal.

The domain inverted portions are generally bounded by surfaces that contain the natural c-axis of said ferroelectric crystal. Domain inversion reverses the c-axis direction, whether it is in the plane of the transducer (X-cut material) or perpendicular to it (z-cut material) or at some intermediate angle (36 degree and 163 degree rotated y-cut materials). Thus, whatever the cut utilized, the domain inverted regions are bounded by surfaces that contain the c-axis.

The ferroelectric crystal can comprise lithium tantalate (LT) or lithium niobate (LN). The LN or LT crystal can be cut in the 163 degree rotated y-cut or the x-cut to provide an acoustic shear wave transducer. The domain inverted portions can be formed on surfaces of the x-cut or 163° rotated y-cut and will typically extend perpendicular from the surface, i.e. into the depth of the material by an amount which is generally several tens of µm, and which increases with the processing time.

The first and second electrodes can comprise finely patterned electrodes including a continuous region proximate to its center and a discontinuous region, a pattern in the discontinuous region comprising a plurality of spaced apart features electrically connected to the continuous region. In this embodiment, feature sizes of the features in the pattern are preferably sufficiently small to provide a fine structure far field condition for an acoustic wave emerging from the ferroelectric crystal underlying the discontinuous region beginning <5 mm therefrom.

The plurality of spaced apart domain inverted portions are preferably arranged to focus an emitted acoustic wave, including the embodiment where the cut utilized provides an acoustic shear wave.

An acousto-optic (AO) device for generating a highly apodized acoustic wave field comprises an acoustic transducer for emitting an acoustic wave comprising a ferroelectric crystal including a plurality of spaced apart domain inverted portions and at least one non-inverted portion, and an electrode layer on one side of the ferroelectric crystal electrically contacting both the domain inverted portion and the non-inverted portion of the ferroelectric crystal. On a side of the ferroelectric crystal opposite the electrode layer a first electrode is disposed on the domain inverted portions spaced apart from a second electrode disposed on the non-inverted portion, wherein sub-transducers hooked in series are formed having an area defined by an area of the first and second electrodes. The first and second electrodes comprise patterned electrode layers, the patterned electrode layers including a continuous region proximate to its center and a discontinuous region, a pattern in the discontinuous region comprising a plurality of spaced apart features electrically connected to the continuous region. An AO interaction crystal for receiving the acoustic wave is attached to the electrode layer, wherein feature sizes of the features in the pattern are sufficiently small to provide a fine structure far field condition for the acoustic wave in the AO interaction crystal underlying the discontinuous region beginning <5 mm measured from an interface between the ferroelectric crystal and the AO interaction crystal. The AO device can comprise an acousto-optic tuneable filter (AOTF). A single RF power supply can power the device where one output of the power supply connected to the electrode layer and the other of the outputs connected to the first and second electrodes, wherein a steerable phased array acoustic transducer is provided by the acoustic beam being steerable as a function of a drive frequency applied by the RF supply.

A method of dynamically steering an acoustic beam comprises the steps of providing a transducer comprising a ferroelectric crystal including a plurality of spaced apart domain inverted portions and at least one non-inverted portion, an electrode layer on one side of the ferroelectric crystal contacting both the domain inverted portions and the non-inverted portion of the ferroelectric crystal, and on a side of the ferroelectric crystal opposite the electrode layer, a first electrode disposed on the domain inverted portions spaced apart from a second electrode disposed on the non-inverted portion, wherein sub-transducers hooked in series are formed having an area defined by an area of the first and second electrodes. An electrical drive signal corresponding to the desired acoustic signal is applied across the transducer. Through varying the electrical signal the acoustic frequency of the acoustic signal is time varied, wherein an angle of the acoustic wave emitted by the transducer relative to a normal of the transducer changes as a function of the acoustic frequency.

BRIEF DESCRIPTION OF THE DRAWINGS

A fuller understanding of the present invention and the features and benefits thereof will be obtained upon review of the following detailed description together with the accompanying drawings, in which:

FIG. 1(a) shows a depiction of localized inversion of one half the area of a rectangular ferroelectric plate to a depth of L, while FIG. 1(b) shows inverted regions ($R_1$ and $R_2$) having arbitrary shapes.

FIG. 2(a) show a cross sectional schematic of an as bonded domain-inverted plate T of a ferroelectric; FIG. 2(b) the result of lapping down the plate shown in FIG. 2(a) to the point where the inverted regions extent completely through the remaining material, while FIG. 2(c) shows a uniform top electrode layer of Cr/Au deposited on the top surface of the ferroelectric plate which takes place after the lapping and polishing.

FIG. 3(a) shows a cross sectional schematic of a biased acousto-optical device having a conventional transducer, while FIG. 3(b) shows a cross sectional schematic of a biased acousto-optical device having a conventional radiation resistance enhanced transducer using bonding of two opposing transducer halves, while FIG. 3(c) shows a cross sectional schematic of a biased acousto-optical device having a radiation resistance hardened transducer according to an embodiment the invention. The transducer in FIG. 3(c) uses domain inversion to increase the radiation resistance of the transducer without having to bond two opposing transducer halves.

FIG. 6(a) is a schematic of domain inverted transducer suitable for producing focused cylindrical waves, while

DETAILED DESCRIPTION

An acoustic transducer comprises a ferroelectric crystal having a plurality of spaced apart ferroelectric domain inverted regions and at least one non-inverted portion. An electrode layer is disposed on one side of the crystal contacting both the domain inverted portions and the non-inverted portion of the crystal. On a side of the crystal opposite the electrode layer, a first electrode is disposed on the domain inverted portions spaced apart from a second electrode disposed on the non-inverted portion. As a result, the acoustic transducer provides sub-transducers hooked in series having effective areas defined by the areas of their respective electrodes.

The domain inverted or part-inverted regions can be either of the two commonly used shear wave cuts of LN and LT, the x-cut or the 163° degree rotated y-cut. Such transducers can be used to enhance the performance of AO shear wave devices, including AOTFs and beam deflectors. Specifically, advantages of the present invention include the following:
(1) Increasing the radiation resistance and simultaneously reducing the capacitance, by series connection of a plurality of sub-transducer elements provided by a single ferroelectric crystal.
(2) Generation of a wider variety of apodized acoustic wave-fields including steerable acoustic fields and focussed acoustic fields, than is possible with available single-polarity LN or LT shear wave transducers.
(3) Another way of adjusting the local piezoelectric activity of an acoustic transducer.
(4) For facilitating the production of a phased array acoustic transducer. This aspect is of particular relevance to the construction of high performance acousto-optic beam deflectors.

Figures 1A, 1B:
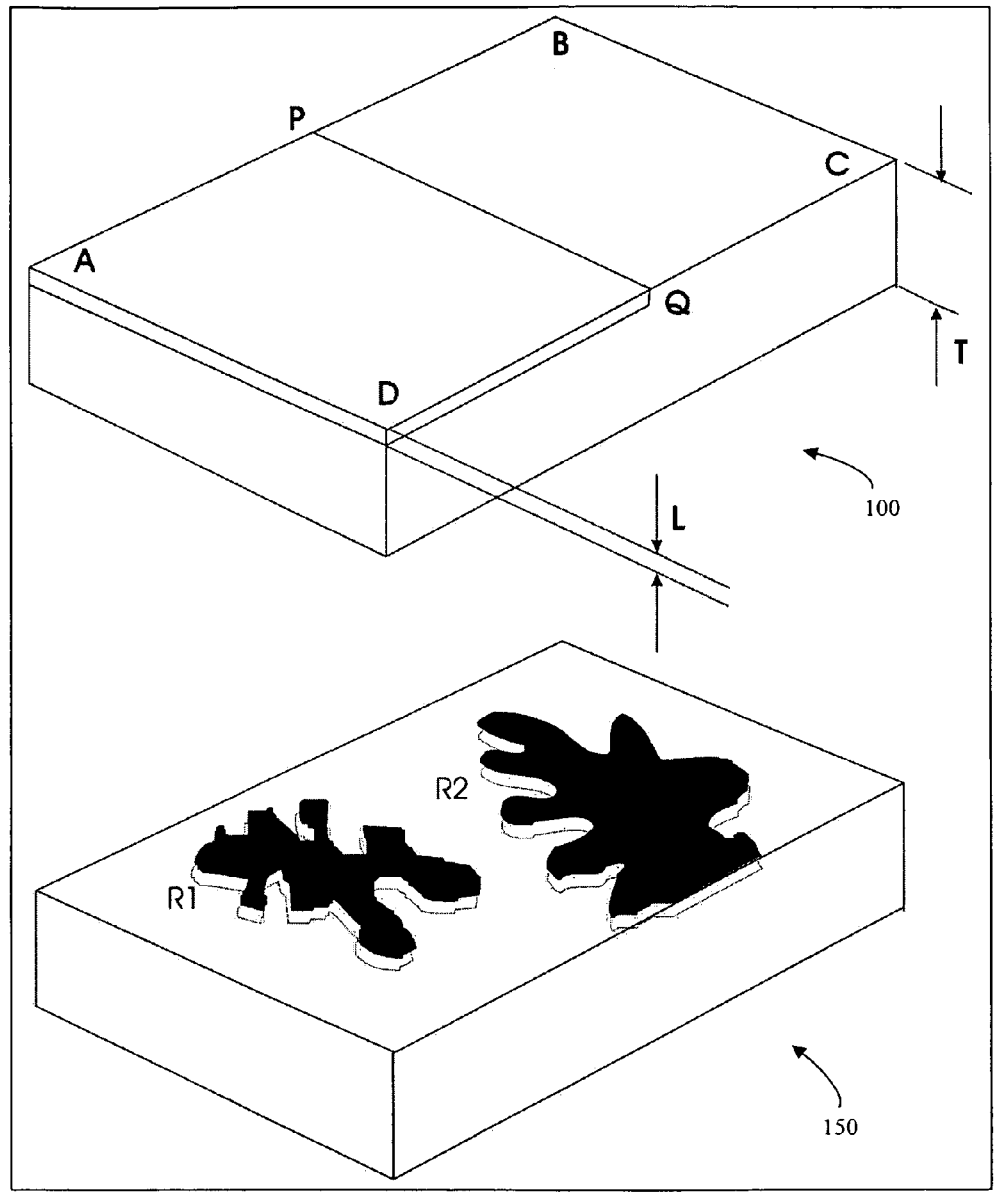

Regarding (1), increasing the radiation resistance by series connection of a number of (sub) transducer elements, FIG. 1(a) shows a single crystal ferroelectric plate ABCD 100 of thickness T. The ferroelectric crystal can be LN or LT, or other suitable ferroelectric. FIG. 1 shows the plate being rectangular, but this is not essential. Using a suitable method, such as the methods described above in the background, a region APQD of plate 100 is rendered domain-inverted, while region PBCQ of plate 100 is left not domain-inverted.

In one embodiment, selective domain inversion of 163°-rotated y-cut LN is achieved by diffusing titanium into selected regions of the surface of an LN wafer and heating the wafer to a temperature of approximately 1000° C. as disclosed in Nakamura K et al, "An ultrasonic transducer for second harmonic imaging using a $LiNbO_3$ crystal", IEEE Transactions on Ultrasonics, Ferroelectrics and Frequency Control, Vol. 53, No. 3, March 2006, p 651-655. The discrete areas of titanium (Ti) are defined by using standard techniques of photolithography followed by vacuum deposition of Ti metal in a layer up to several hundred nm thick. After this, the wafer is typically placed in a furnace and the temperature slowly ramped up to the set temperature and back down to room temperature after several hours. A typical rate of temperature change is approximately 50° C./minute). After this time the domain inversion of the Ti— indiffused regions have penetrated to a depth of several tens of μm, which is generally a sufficient depth for use with the present invention. In the case of both LT and LN, domain inversion has been reported to occur in the neighbourhood of one surface for heat treatment alone (Nakamura K, et al, "Ferroelectric domain inversion caused in $LiNbO_3$ by heat treatment", Applied Physics Letters, Vol. 50, part 20 May 1987, p 1413-1414 and Nakamura K, et al., "Broadband ultrasonic transducers using a LiNbO3 plate with a ferroelectric inversion layer", IEEE Transactions on Ultrasonics, Ferroelectrics and Frequency Control, Vol. 50, No. 11, November 2003, p 1558-1562, although selective inversion is impossible to achieve in this way. In the case of X-cut LT, domain inversion at the −X face has been reported to occur in narrow regions after proton exchange in a bath of pyrophosphoric acid at 260° followed by heat treatment at approximately 540° C.-590° C. as disclosed in Mizuuchi K et al., "Fabrication of periodic domain inversion in x-cut LiTaO3", Applied Physics Letters, Vol. 62, No. 16, April 1993, p 1860-1862.

The domain inversion layer extends into the plate for a distance L, which will typically be in excess of 20 μm, such as 30 μm, 40 μm, 60 μm or 80 μm. The boundary (domain wall) PQ between the domain inverted portion APQD and the non-inverted plate portion PBCQ, is shown in FIG. 1(a) to be a straight line. As described below, the domain inverted portion and non inverted portion are provided separate top electrodes (equal area) and are hooked in series via an electrically conductive bottom layer thus raising the total radiation resistance and simultaneously reducing the capacitance of the transducer.

Boundaries need not be linear. For example, FIG. 1(b) shows a ferroelectric crystal 150 having inversion of two arbitrary shaped surface regions, $R_1$ and $R_2$, in which none of the boundary, except by a portion defined by the plate edge itself, is in the form of a straight line.

Figures 2A, 2B, 2C:
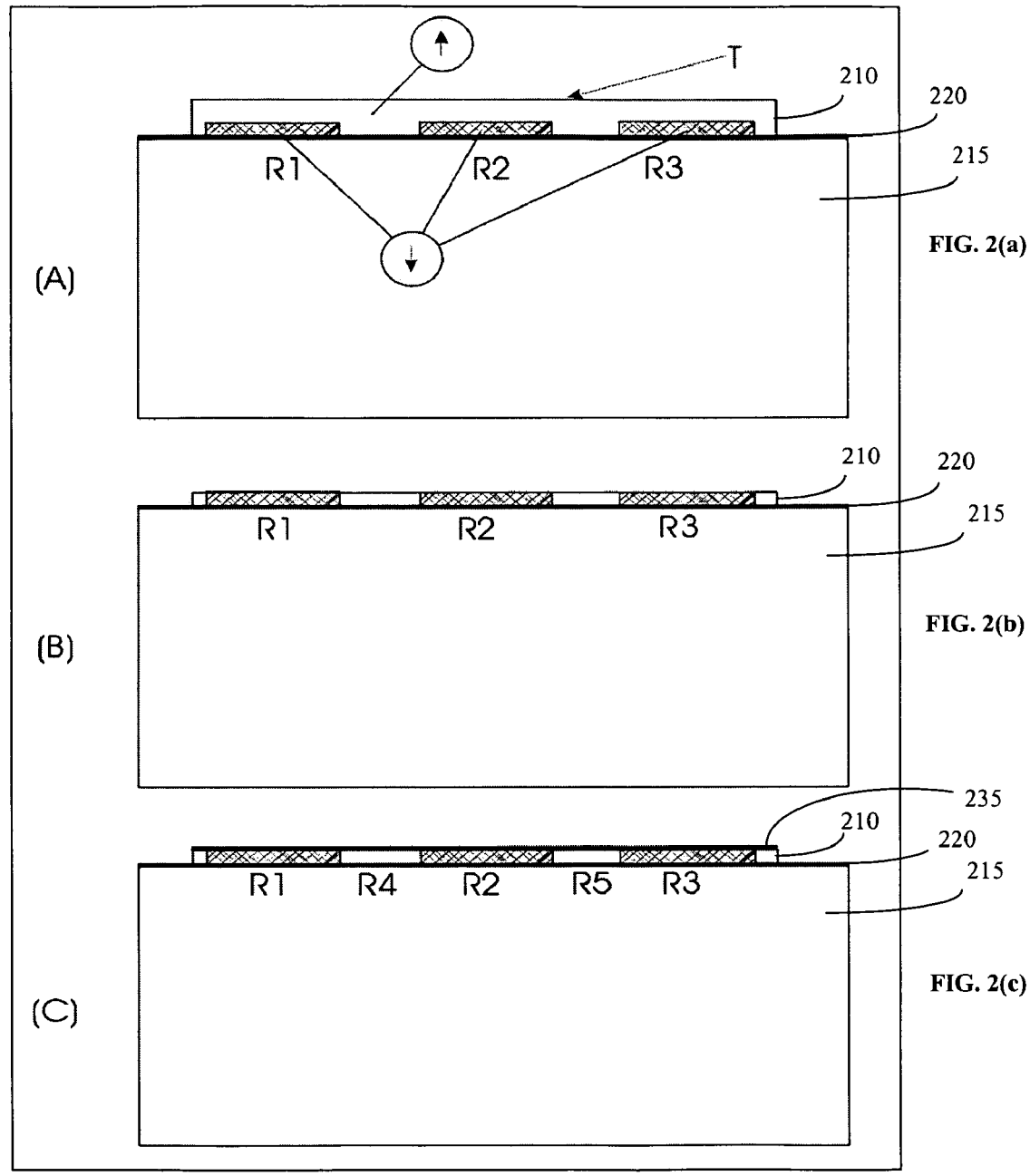

After the domain inverted region(s) have been formed, the ferroelectric plate is generally coated by a thin layer of an electrically conductive material, such as Cr/Au using vacuum deposition in the typical way. For example, 10 nm Cr followed by 100 nm Au can be compression bonded using indium to a similarly coated optically flat acousto-optic (AO) crystal. FIG. 2(a) shows a metal coated ferroelectric plate (T) 210 having ferroelectric inverted regions (shown having an arrow down) $R_1$, $R_2$ and $R_3$, with the remainder of plate (e.g. regions between $R_1$ and $R_2$, and $R_2$ and $R_3$) being non-inverted (shown having an arrow up) bonded to AO crystal 215, inverted domain side down. The thin Cr/Au layer 220 is disposed between metal coated ferroelectric plate (T) 210 and AO crystal 215.

After bonding, the metal coated ferroelectric plate (T) 210 is lapped and polished down until the design thickness of the transducer is achieved, this design thickness being calculated beforehand using well known AO design theory to result in the structure shown in FIG. 2(b). Following lapping, a uniform top electrode layer is deposited thereon, such as Cr/Au 225. FIG. 2(c) shows the resulting device following top electrode deposition. $R_4$ and $R_5$ represent non-domain inverted regions. The transducer shown in side-view in FIG. 2(c) may be used to realize the phased-array acousto-optic device of FIG. 5 described below. A phased array transducer so produced can also be used to make an acousto-optic deflector, since the acoustic beam so produced is "steered" as the acoustic drive frequency is varied, according to equation (1) described in paragraph 49 below.

The principal difference between conventional transducers and transducers according to the invention is that transducers according to the invention provides a single transducer crystal having localized regions of domain inverted material alongside regions of non-domain inverted material. In these regions ($R_1$, $R_2$ and $R_3$ in FIGS. 2(a)-(c)) the crystal c-axis (referred to by some as the z-axis) is domain inverted with respect to the rest of the crystal plate. This is represented by the up-arrows and down-arrows for simplicity. However, it is noted that (i) there is no absolute significance in "up" or "down" in the context of these transducers, and (ii) the arrow is meant to represent only the (relative) sense of the crystal c-axis which is in general not normal to the surface of the plate, since z-cut material is not being considered.

Figures 3A, 3B, 3C:
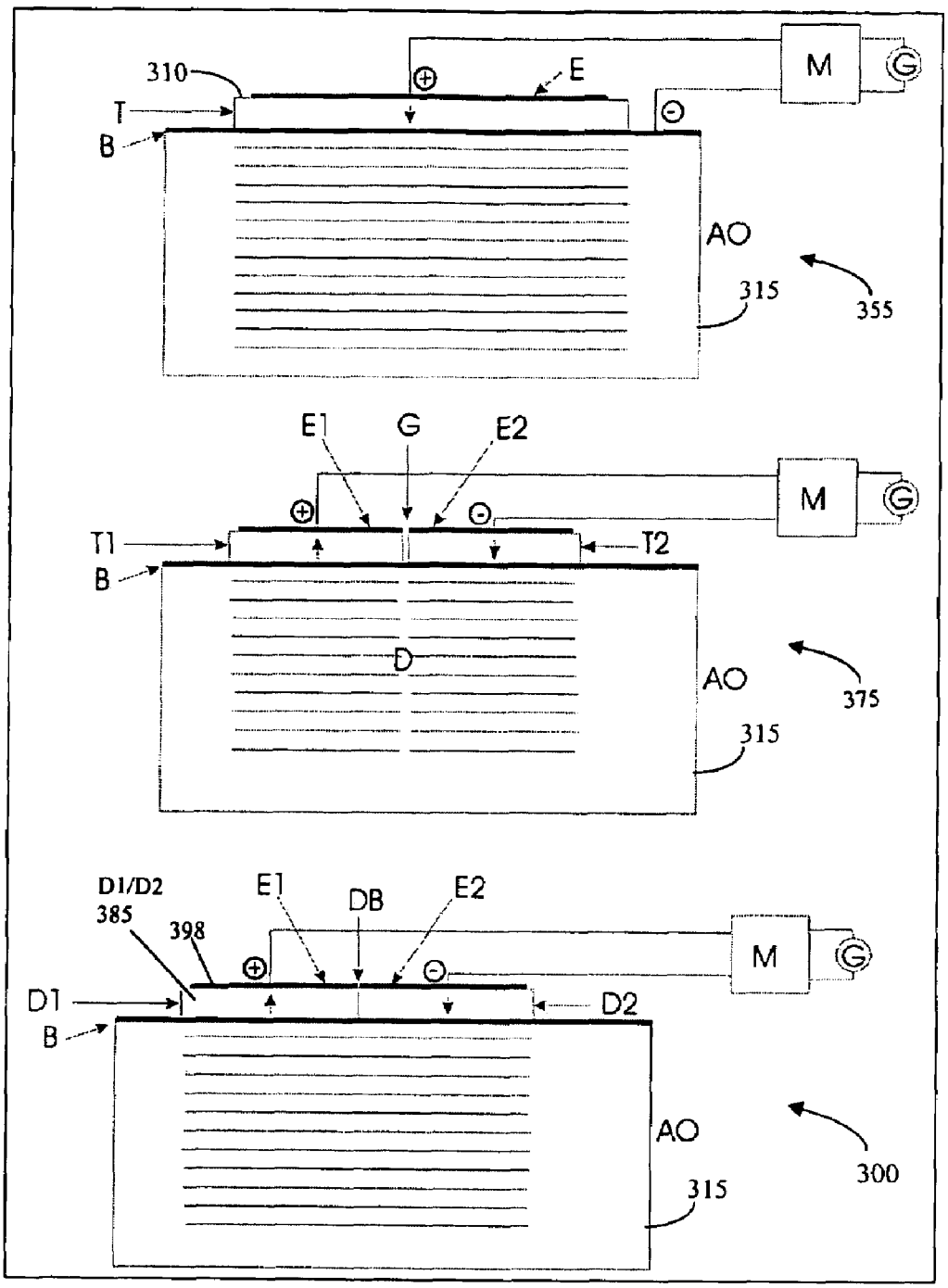

FIG. 3(a) shows a cross sectional schematic of an acousto-optical device 355 having a conventional transducer (T) 310, while FIG. 3(b) shows a cross sectional schematic of an acousto-optical device 375 having a conventional radiation resistance enhanced transducer ($T_1$ and $T_2$) realized by bonding of two opposing transducer halves ($T_1$ and $T_2$) to an AO crystal 315. Referring to FIG. 3(a), a single transducer 310 is bonded to an AO crystal (AO) 315, with a top electrode E and a bottom electrode B. B is preferably a film of Cr/Au deposited onto the AO crystal. E is preferably a thin film of Cr/Au deposited onto the top of the transducer, such as 10 nm of Cr followed by 250 nm of Au. It is assumed that the form of the top electrode E is a rectangle, although it can include different shapes.

An RF generator G supplies electrical power across the transducer through a matching circuit M which converts the impedance of the transducer 310 to an impedance approximating 50Ω for the range of RF frequencies called for in the design to minimize wave reflections. A problem generally arises with large area top electrodes generally used for imaging AOTFs, in which top electrodes of approximately 12 mm wide by 22 mm long are used in a typical device. It is well known that increasing the area of the top electrode results in two (2) effects: (i) increasing the capacitance between electrodes E and B and (ii) decreasing the radiation resistance of the transducer. These two items taken together make it difficult to design a matching network which works well over the full tuning range and has low electrical (Ohmic) losses. Low electrical losses are desirable in the matching circuit (M) because high losses cause a proportion of the power supplied by the generator G to be dissipated as heat. This is undesirable as it wastes power, and heats up the AO crystal 315. Heat also causes undesirable changes in its optical properties of the AO crystal 315 since the matching network (M) is generally mounted very close to the AO crystal 315.

The conventional way of minimizing this problem is to form a transducer by bonding 2 or more sub-transducers crystals with as small as possible air gap (G) between the sub-transducer crystals and to connect the sub-transducers electrically in series using metallization. This simultaneously increases the radiation resistance (series resistances add) and reduces the capacitance. Thus, the conventional arrangement shown in FIG. 3(b) includes two (2) spaced apart sub-transducer crystals $T_1$ and $T_2$ separated by air gap G. In practice, use of more than 2 sub-transducers is rare. Note that in this arrangement, each output of the generator (G) is connected to transducer top electrodes $E_1$ and $E_2$, and the bottom electrode (B) which is electrically common to both transducers is left electrically floating. The generator (G) supplies an alternating voltage, so the polarities (+ and −) shown in circles applied to $E_1$ and $E_2$, respectively, represent a "snapshot" in time.

If, as is often the case, the two sub-transducers are made by cutting a single rectangular LN or LT plate in half, then one of the halves must be physically rotated by 180° before bonding. This is usually achieved by temporarily affixing the two halves onto a substrate and in the correct juxtaposition using wax, bonding as before. However, this arrangement is very inconvenient and prone to cracking during the bonding operation, unless the plates are flat to very high order. If the transducers were not "flipped", then considering the acousto-optic device 375, at some instant in time the left-hand sub-transducer shown in FIG. 3(b) has its top electrode positive relative to the bottom electrode. The right-hand sub-transducer, however, has its top electrode negative relative to the bottom electrode. This would have the effect of producing acoustic waves from the left hand side which were 180° out of phase with those produced by the right hand side. The air gap G between the sub-transducers $T_1$ and $T_2$ leads to a discontinuity D in the resulting wave field of AO crystal 315, but if the transducer flipping was not performed, the acoustic wavefronts would be displaced by one half-wavelength also, and the device would not work as desired. This situation is generally corrected by flipping one of the two transducers, effectively reversing the sign of the piezoelectric tensor components so that (symbolically):

(+ve directed E-field)*(+ve tensor components)=(+ve phase) left-hand side (−ve directed E-field)*(−ve tensor components)=(+ve phase) right-hand side and the resulting acoustic phases from the two halves are matched as desired.

Assembly of the sub-transducer $T_1$ and $T_2$ crystals results in an air gap (G) that is generally at least 30 to 40 μm wide. This gap results because of the difficulty of mechanically aligning two separate pieces of transducer material (usually LN) and keeping them aligned during the pressure bonding operation, where the transducer is forced against the acousto-optic crystal with a thin (typically 1 µm thick) layer of indium between the two. This is usually done inside a vacuum chamber incorporating a hydraulic press and it is difficult to stop the pieces moving relative to one another during this operation. Even if the transducer flipping has been performed and the phase discontinuity is avoided, the nominal 40 µm air gap (G) and the resulting low value of acoustic field in the region D of AO crystal 315 still causes a significant intensity discontinuity in the AO crystal. This prevents the sidelobes being reduced to acceptable levels required for certain applications, such as for typical imaging applications. In practice, if the air gap (G) is more than approximately 10 µm long, sidelobe suppression of more than 25 dB will not be obtainable, irrespective of the apodization arrangement employed.

Localized ferroelectric domain inversion according to the invention can be used to solve this intensity discontinuity problem because there is no air gap required because both sub-transducers are both formed on the same crystal. FIG. 3(c) shows a cross sectional schematic of a radiation resistance enhanced transducer acousto-optical device 300 according to an embodiment of the present invention. Acousto-optical device 300 comprises an acoustic transducer embodied as a ferroelectric crystal 385 having at least one ferroelectric domain inverted region D1 and at least one non-inverted region D2. D1 is domain inverted (180 degrees out of phase) relative to domain D2. Acoustic device 300 thus uses domain inversion to increase the radiation resistance of a single integrated (one-piece) transducer without having to bond two opposing transducer halves as with the transducer shown in FIG. 3(b). An electrode layer 390 is disposed on one side of the crystal 385 contacting both the domain inverted portion D1 and the non-inverted portion D2 of the crystal. On a side of the crystal opposite the electrode layer 390, a first electrode 398 is disposed on the domain inverted portion D1 spaced apart from a second electrode 395 disposed on the non-inverted portion D2. As a result, the acoustic transducer 385 provides sub-transducers hooked in series having effective areas defined by the areas of their respective electrodes.

The use of a single pre-treated domain-inverted transducer plate also means that the gap between the electrodes on the respective sub-transducers is only needed to electrically isolate the two halves of the transducer plate 395 and 398 from arcing across the air gap to one another, and thus can be as small as a few microns, such as 2 or 3 microns, under normal bias conditions. The actual thickness of the domain boundary wall (shown as DB in FIG. 3(c)) between the inverted and non-inverted ferroelectric material is generally less than 5 microns wide, and may be considerably less than this, on the scale of a few nms.

As noted above, the invention also provides generation of a wider variety of apodized acoustic wave-fields than is possible with single-polarity LN or LT shear wave transducers. In related U.S. patent application Ser. No. 11/391,829 entitled "ACOUSTO-OPTIC DEVICES HAVING HIGHLY APODIZED ACOUSTIC FIELDS AND METHODS OF FORMING THE SAME" (hereafter the '829 Application), a method of apodizing an acoustic transducer is described therein based on the use of one or both of the following:
(i) Fine patterning of the top electrode metallization in order to achieve a local variation of electric field inside the LN or LT acoustic transducer
(ii) Use of a laser to alter or to de-activate the piezoelectricity in selected regions of the transducer crystal. Either of techniques (i) and (ii) disclosed in the '829 application allows shaping or apodizing the acoustic field according to the present invention to achieve, for example, a Gaussian variation of acoustic field strength in one direction, this being shown therein to be advantageous for the production of acousto-optic tuneable filters (AOTFs) having low sidelobe levels compared to conventional AOTF devices. However, even using the teachings of the '829 application it is not possible to synthesize an acoustic field having a relative weighting which take on negative values in some regions.

The present invention provides the ability to synthesize acoustic fields having relative weightings which take on negative values in some regions of the transducer. The ability to provide negative values is highly advantageous in certain applications. For example, it is known that the passband shape of an AOTF is well approximated by the square of the modulus of the Fourier transform of the acoustic field envelope (reference). Thus, if it is desired to produce an AOTF having an approximately rectangular wavelength bandshape function, it is desirable to have the acoustic transducer radiate an acoustic field which could be described as an approximation to a "sinc" ($\sin(x)/x$)) function, since it is well known that the Fourier transform of the sinc function is a rectangular function. Prior to the present invention, the problem in achieving a sinc function is that the sinc function contains regions where the function includes negative values, as shown in FIG. 4(a).

Figure 4A:
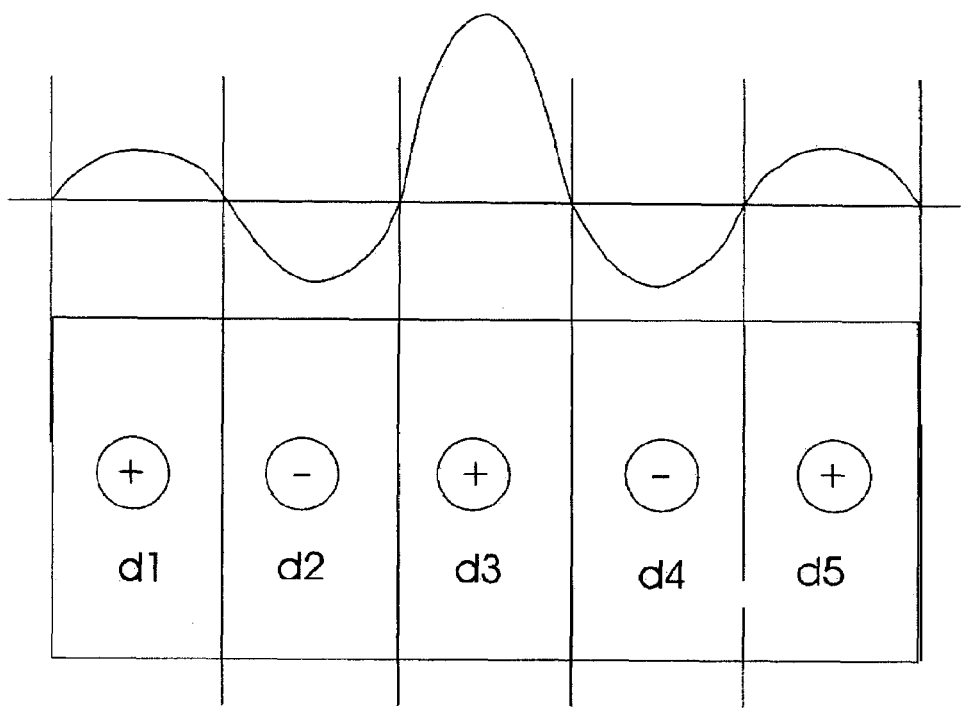
FIG. 4(a) shows a portion of a "sinc" function along with accompanying ferroelectric domain inversion (−) noted in regions where the acoustic wave field is in antiphase.

In FIG. 4(a) the sinc function is shown, truncated to 5 loops, 3 positive and two negative. The invention provides the ability to provide both positive and negative regions, with the negative regions corresponding to regions of the transducer radiating in antiphase (180 degrees relative to) the positive regions at any instant of time. Domain inverted regions of the ferroelectric transducer crystal provide this phase reversal, with acoustic waves emitted from these regions being 180° out of phase with those emitted from the non-inverted regions of the transducer crystal. This is also shown schematically in FIG. 4(a), where the regions (domains) $d_2$ and $d_4$ are domain inverted to generate the antiphase acoustic signals relative to the non-inverted regions (domains) $d_1$, $d_3$, and $d_5$. It is understood that the process of obtaining the domain inverted regions as described above can be heat treatment or other suitable treatment followed by bonding, lapping, etc., to leave a transducer thickness in which the inverted domains extend right through the thickness of the remaining material. It is also noted that the domain boundaries between inverted and non-inverted regions (e.g. between $d_1$ and $d_2$) are arranged to fall at (or essentially at, such as within 1 micron) of a zero (root) of the sinc function.

Figure 4B:
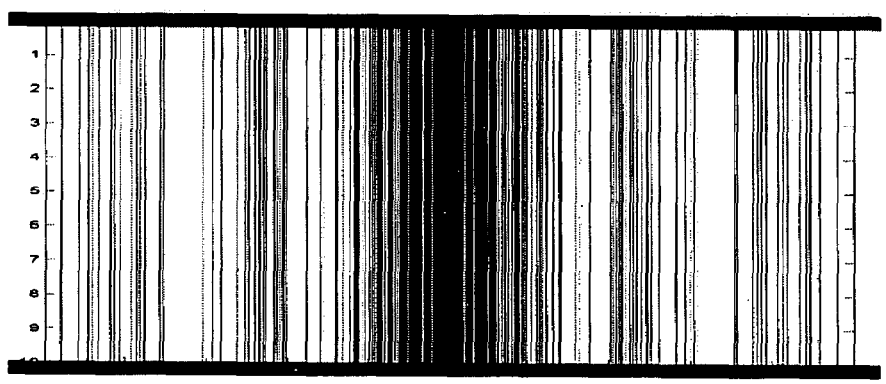
FIG. 4(b) shows an exemplary electrode pattern that can be used along with the localized ferroelectric domain inversion according to the invention to provide an acoustic transducer providing simultaneously arbitrary variation of acoustic amplitude and arbitrary regions of 180° acoustic phase reversal, as a function of position on the transducer along its area.

After the inverted transducer plate is obtained, the finely patterned metal pattern as disclosed in the '829 application, such as the electrode pattern shown in FIG. 4(b), can be deposited onto the surface of the transducer crystal and defined using the standard techniques of photolithography. This pattern shown is for illustration only, where all vertical metal "fingers" are of the order of one acoustic wavelength wide, but their area density is varied to provide the appropriate weighting to obtain the modulus of the sinc function.

Thus, using the techniques disclosed in the '829 application, an acoustic field can be provided whose strength (amplitude) is the modulus of the sinc function. However, this is of little use since the resulting bandshape function is not the desired rectangular function. Localized domain inversion according to the invention allows varying the phase as well as amplitude, and this combination is thus more powerful than the amplitude alone. Such a device having this combination provides simultaneously arbitrary variation of acoustic amplitude and arbitrary regions of 180° acoustic phase reversal, with position on the transducer, allowing synthesis of a greater variety of passband filter shapes. The simulation described in the Examples section demonstrates the wide passband provided by AOTFs according to the invention having localized domain inversion described herein combined with the finely patterned electrode features disclosed in the '829 application.

Figure 5:
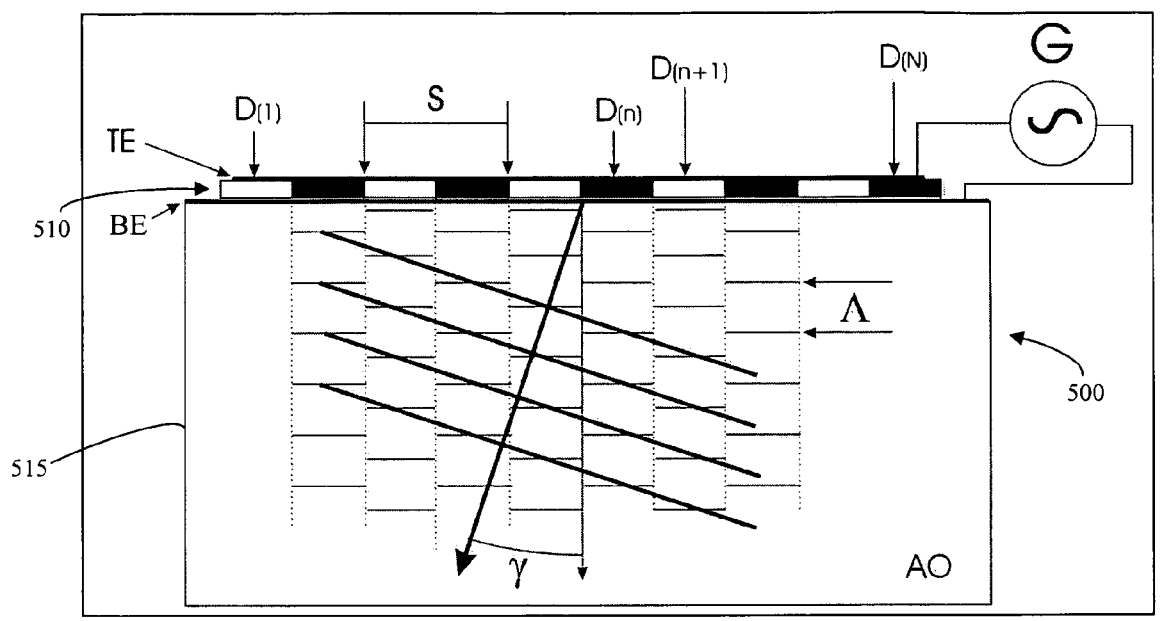
FIG. 5 is a schematic side-view of acousto-optic device according to the invention in which an acoustic wave is launched at an angle γ to the transducer normal using a phased array acoustic transducer comprising ferroelectric domain (S) in the form of "stripes" of alternating polarity.

Improved phased array transducers can also be provided using the invention. Specifically, the invention can be used to form a steerable phased array transducer using localized domain inversion described herein. This is particularly useful in applications for acousto-optic beam deflectors and AOTFs. FIG. 5 shows a schematic side view of an exemplary acousto-optic device 500 having a phased array acoustic transducer 510 comprising ferroelectric domains in the form of "stripes" of alternating polarity (D(1), ... ). The ferroelectric domains are of alternating polarity, thus domain D(n) is of opposite polarity to that of D(n+1). The domains are obtained by the methods of inversion, transducer bonding, lapping and polishing, as described above. The alternating (light and dark) regions are shown of equal lateral extent, but this equality not required. The total period of the structure (length of inverted domain +length of un-inverted domain) is denoted by S. In practice, S will be in the range of tens to hundreds of microns.

The transducer 510 is bonded to AO crystal 515. Transducer 510 includes top electrode (TE) and Bottom electrode (BE). An RF power supply (G) provides AC bias across transducer 510. An acoustic wave is shown launched at an angle γ relative to the transducer normal using the phased array acoustic transducer shown.

Although bottom electrode (BE) and top electrode (TE) are shown as being rectangular in this embodiment shown, the apodizing techniques disclosed in the '829 application can be used. Using fine electrode patterning as disclosed in '829 application, a dynamically steerable apodized acoustic beam can be provided, as described below.

The ability to generate a dynamically steerable apodized acoustic beam is expected to be very useful in certain applications, for example, for an AOTF where it is desired to increase the tuning range over the 1 octave limit normally available. Another application where this embodiment is of major importance is for acousto-optic beam deflectors. Regarding acousto-optic beam deflectors, the ability to steerable acoustic beams allows the construction of devices having superior performance in terms of achievable resolution as compared to fixed beam devices.

Regarding quantifying the dynamically steering, it can be shown that the angle γ of the acoustic wave relative to the transducer normal is given by:

$$\gamma(F) = \frac{pV}{2sF} \quad (1)$$

where V is the acoustic velocity associated with the wave, F is the acoustic frequency supplied by the RF power supply G, s is the inversion period and p is an integer (p=±1, ±2, ±3 ... ). By changing the frequency of the AC signal applied by RF generator G, the angle γ of the acoustic wave relative to the transducer normal changes, thus providing the desired dynamic steering feature.

The case of ±1 is the most significant since most of the acoustic power is known to be in this mode. FIG. 5 shows the situation in which the tilted wavefronts are synthesized by the wavefronts of the individual sub-transducers of device 500, thus adjacent columns (under the respective sub-transducers) are 180° out of phase because of domain inversion. The angle γ is typically small, under 10°, and is shown greatly exaggerated in FIG. 5 for clarity. Two sets of wavefronts are actually produced by the arrangement shown in FIG. 5, one at +γ (shown) due to the value p=+1, and the other at −γ (not shown) due to the p=−1 case. The two pairs of wavefronts are therefore symmetrically placed around the normal direction.

Localized ferroelectric domain inverted transducers according to the invention can used to provide improved transducers, in exemplary applications beam deflectors for application to optical manipulation of small particles, image projection systems, AOTFs covering in excess of one octave tuning range for applications including advanced hyperspectral imaging systems. Although generally described applied to AOTFs, as noted above other acousto-optic devices including, but not limited to, acousto-optic modulators (AOM), acousto-optic beam deflectors (AOBD), Bragg cells (BC), acousto-optic frequency shifters (AOFS) and acousto-optic correlators (AOC) can benefit from selective domain inversion according to the invention focusing the acoustic field in order to increase the strength of the acousto-optic interaction in some region of space inside the interaction crystal.

Figure 6A:
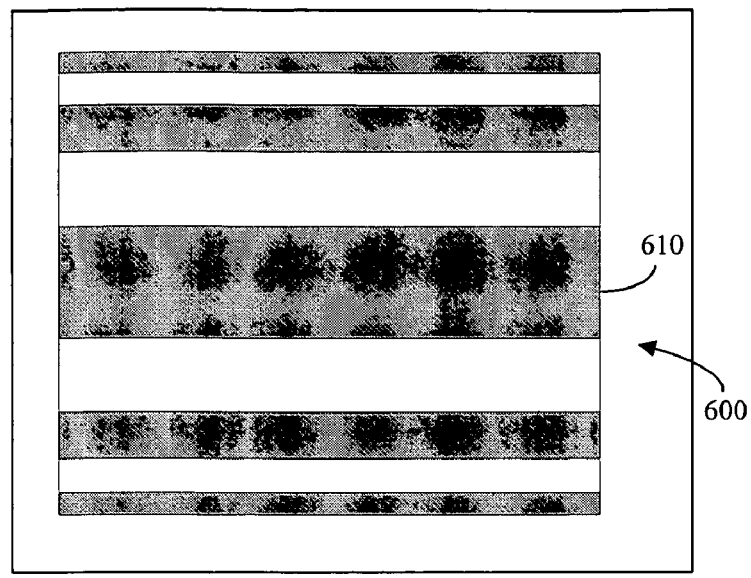
Figure 6B:
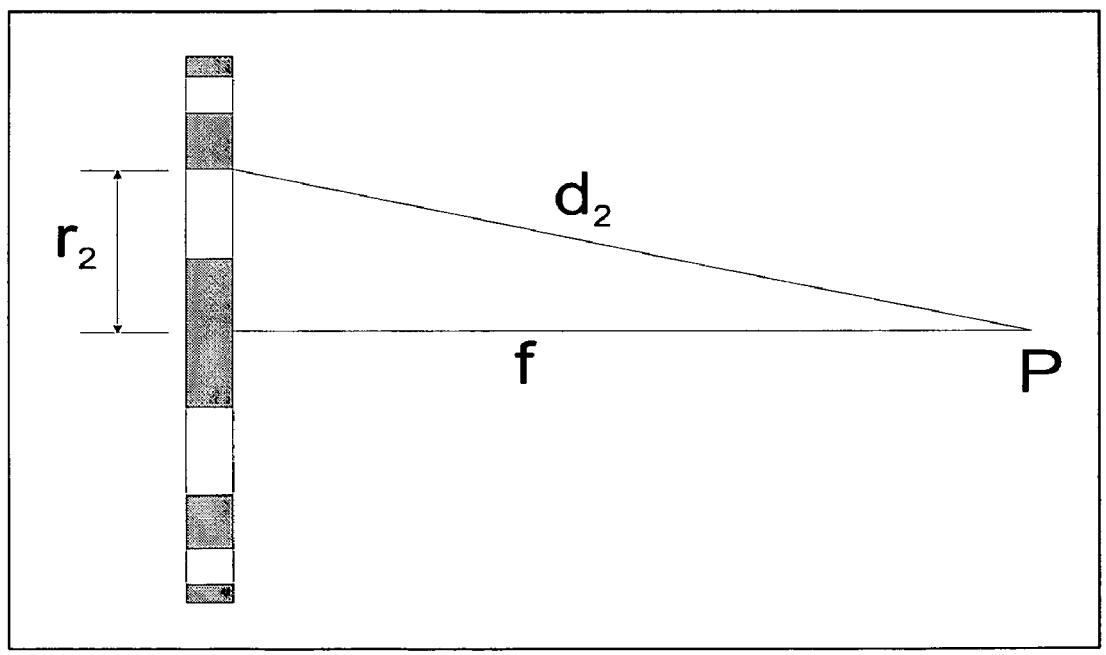
FIG. 6(b) is a side view of transducer shown in FIG. 6(a) showing various dimensions for producing a line focus normal to the paper and through P.

Focussed acoustic wave transducers were demonstrated for example in the case of longitudinal acoustic waves by Lawrow, Pannell et. al. (Lawrow A., Pannell C N, Negoita M, Russell P S J, Webjorn J, "Focused acoustic wave acousto-optic device using a planar domain-inverted lithium niobate transducer", Optics Communications, 15 Dec. 1997, vol. 144, no. 4, pp. 161-164.). A description of a focused planar acoustic transducer using domain inversion is now provided. In order to produce a cylindrical focus, for example, the domain inverted acoustic transducer is preferably in the form of parallel stripes of alternating polarity, the transducer 600 arrangement being symmetrical about the (widest) central stripe as shown in FIG. 6(a). The transducer shown contains 5 domain inverted stripes 610, shown shaded. This arrangement acts as a "Fresnel zone source" with the widths and positions of the various stripes arranged so that there is constructive interference at the desired line focus normal to the paper and through P, as shown in FIG. 6(b). The latter condition yields the following formula for successive positions of the boundaries between the domain inverted regions:

$$r_n = \sqrt{\frac{(2n-1)\lambda}{2}\left\{f + \frac{(2n-1)\lambda}{8}\right\}}, n = 1, 2, 3 \ldots \quad (2)$$

where f is the distance to the primary focus, and λ is the acoustic wavelength. A progressively sharper focus is obtained, as more stripes are included.

The advantage is that the generation of a focussed acoustic wave usually requires a source which is non-planar and therefore incompatible with the industry-standard techniques of transducer bonding, which require planar surfaces. The present invention provides the ability to generate focussed shear acoustic wave fields and so produce regions of high acoustic intensity. This has immediate advantages for other types of acousto-optic device such as acousto-optic frequency shifters and modulators. Such advantages include lower drive power operation, and faster device switching times without sacrificing diffraction efficiency.

EXAMPLES

It should be understood that the Examples described below are provided for illustrative purposes only and do not in any way define or in any way limit the scope of the invention.

A simulation was performed based on an AOTF having an acoustic transducer according to the invention including a transducer crystal having localized ferroelectric domain inversion regions and non-inverted regions as shown in FIG. 4(a) which implements the "sinc" function, together with the fine electrode pattern shown in FIG. 4(b). As noted above, such a device provides simultaneously arbitrary variation of acoustic amplitude and arbitrary regions of 180° acoustic phase reversal, with position on the transducer. The parameters selected for simulation were: center wavelength, $\lambda_0$=0.5 μm, interaction length L=22 mm, o-ray incident AOTF, $\theta_i$=15.5°.

Figure 7A:
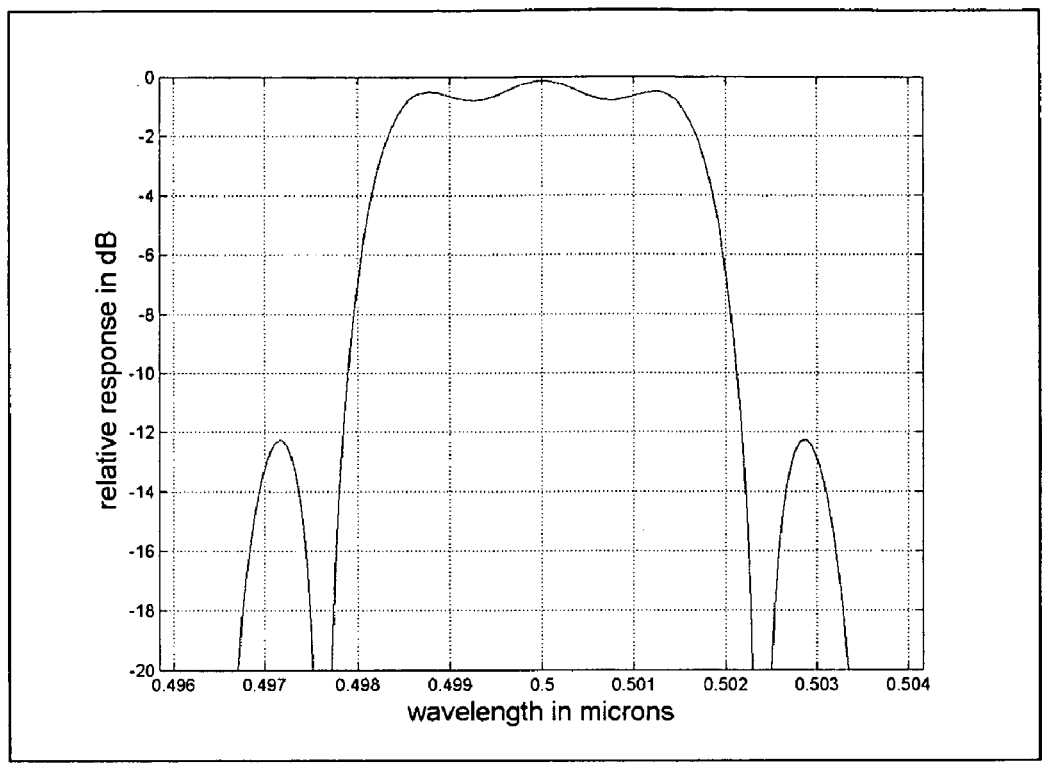
FIG. 7(a) provides simulation results demonstrating a significantly widened passband using localized domain inversion according to the invention to realize a 3-loop sinc-function top electrode comprising AOTF.
Figure 7B:
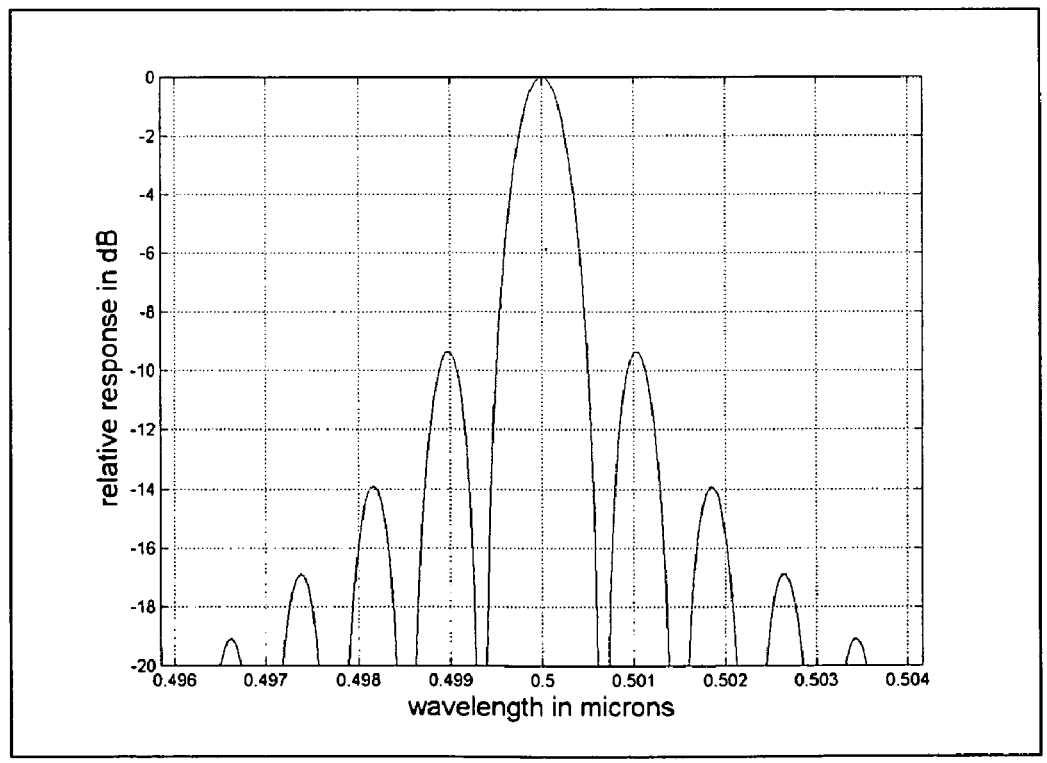
FIG. 7(b) provides simulation results from an AOTF device having an ordinary rectangular uniform top electrode for comparison and no domain inversion).

The resulting AOTF passband obtained from the simulation is shown in FIG. 7(a). FIG. 7(b) shows, for comparison, the passband obtained for an AOTF having a single uniform transducer having no ferroelectric domain inversion or other apodization. The 3 dB bandwidth for the AOTF according to the invention has been broadened from approximately 0.58 nm to approximately 3.5 nm. Thus, a factor of 6 widening of the passband has been obtained. In addition, the sidelobes have been suppressed by a further 3 dB. The power requirement for the passband widened AOTF according to the invention is approximately 5 times that of the uniform transducer of the same length and overall diffraction efficiency. This is to be expected, and is comparable with the width of the composite passband provided if 5 different carefully spaced RF frequencies were put simultaneously into a single uniform transducer. However, the drive circuitry required by the present invention is much simpler and less costly to manufacture, and as a result, devices and related systems according to the invention are expected to be significantly more reliable.

It is to be understood that while the invention has been described in conjunction with the preferred specific embodiments thereof, that the foregoing description as well as the examples which follow are intended to illustrate and not limit the scope of the invention. Other aspects, advantages and modifications within the scope of the invention will be apparent to those skilled in the art to which the invention pertains.

I claim:

1. An acoustic transducer, comprising:
   a non z-cut ferroelectric crystal including a plurality of spaced apart domain inverted portions and at least one non-inverted portion;
   a first electrode layer consisting of a single electrode on one side of said ferroelectric crystal contacting both said domain inverted portions and said non-inverted portion, and
   a second electrode layer on a side of said ferroelectric crystal opposite said first electrode layer.

2. The transducer of claim 1, wherein said ferroelectric crystal consists of one crystal.

3. The transducer of claim 1, wherein said domain inverted portions are bounded by surfaces that contain the natural c-axis of said ferroelectric crystal.

4. The transducer of claim 1, wherein said second electrode layer consists of a single electrode.

5. The transducer of claim 4, wherein said non z-cut comprises the 163 degree rotated y-cut or the x-cut, wherein an acoustic shear wave transducer is provided.

6. The transducer of claim 5, wherein said non z-cut comprises the x-cut.

7. The transducer of claim 5, wherein said non z-cut comprises the 163° rotated y-cut.

8. The transducer of claim 1, wherein at least one of said first and second electrode layers comprise finely patterned electrodes including a continuous region proximate to its center and a discontinuous region, a pattern in said discontinuous region comprising a plurality of spaced apart features electrically connected to said continuous region along a periphery of said first or said second electrode layer.

9. The transducer of claim 8, wherein feature sizes of said features in said pattern are sufficiently small to provide a fine structure far field condition for an acoustic wave emerging from said ferroelectric crystal underlying said discontinuous region beginning <5 mm therefrom.

10. The transducer of claim 1, wherein said plurality of spaced apart domain inverted portions are arranged to focus an emitted acoustic wave.

11. The transducer of claim 5 wherein said plurality of spaced apart domain inverted portions are arranged to focus an emitted acoustic shear wave.

12. An acousto-optic (AO) device for generating a highly apodized acoustic wave field, comprising:
   an acoustic transducer for emitting an acoustic wave, comprising:
   a non z-cut ferroelectric crystal consisting of one crystal including a plurality of spaced apart domain inverted portions and at least one non-inverted portion;
   a bottom electrode layer on one side of said ferroelectric crystal contacting both said domain inverted portions and said non-inverted portion of said ferroelectric crystal, and
   on a side of said ferroelectric crystal opposite said bottom electrode layer a top electrode layer, and
   an AO interaction crystal receiving said acoustic wave attached to said bottom electrode layer, for receiving an acoustic wave launched by said transducer,
   wherein at least one of said bottom and said top electrode consists of a single electrode.

13. The AO device of claim 12, wherein said (AO) device comprises an acousto-optic tuneable filter (AOTF).

14. The AO device of claim 12, further comprising an RF power supply, one output of said power supply connected to said top electrode layer and the other of said outputs connected to said bottom electrode, wherein a steerable phased array acoustic transducer is provided by said acoustic beam being steerable as a function of a drive frequency applied by said RF supply.

15. The AO device of claim 14, wherein both said bottom and said top electrode consist of a single electrode.

16. The AO device of claim 15, wherein said ferroelectric crystal comprises lithium tantalate (LN) or lithium niobate (LT) and said non z-cut is selected from the 163 degree rotated y-cut or the x-cut, wherein an acoustic shear wave transducer is provided.

17. The AO device of claim 12, wherein at least one of said top and bottom electrode layers comprise finely patterned electrode layers including a continuous region proximate to its center and a discontinuous region, a pattern in said discontinuous region comprising a plurality of spaced apart features electrically connected to said continuous region along a periphery of said bottom or top electrode layer.

18. A method of dynamically steering an acoustic beam using a transducer consisting of one non z-cut ferroelectric crystal having a plurality of domain inverted portions and at least one non-inverted portion, and a top electrode and a bottom electrode on opposite sides of said ferroelectric crystal coupled to an AO crystal, comprising the steps of:
   applying an electrical signal at an acoustic frequency across said electrodes to launch a longitudinal or shear acoustic wave field into said AO crystal, wherein said acoustic wave field includes a plurality of in phase and 180 degree phase reversal regions with respect to position on said transducer defined by a distribution of said non-inverted and said domain inverted portions, and time varying said acoustic frequency, wherein an angle of the acoustic wave emitted by said transducer relative to a normal of said transducer changes as a function of said acoustic frequency.

19. The method of claim 18, wherein one of said electrodes comprises a patterned electrode, said acoustic wave field providing a non-constant amplitude defined by said pattern.

20. The method of claim 18, wherein said acoustic wave is launched at a non-zero angle relative to said normal of said transducer.

21. The method of claim 18, wherein an acoustic power associated with said acoustic field is constant in said AO crystal with respect to said position on said transducer.

22. The method of claim 18, wherein said acoustic wave field comprises an apodization function having positive and negative portions.

* * * * *